United States Patent
Kawada

(10) Patent No.: US 9,748,149 B2
(45) Date of Patent: Aug. 29, 2017

(54) METHOD OF MANUFACTURING A SILICON CARBIDE SEMICONDUCTOR DEVICE INCLUDING FORMING A PROTECTIVE FILM WITH A 2-LAYER STRUCTURE COMPRISED OF SILICON AND CARBON

(71) Applicant: FUJI ELECTRIC CO., LTD., Kawasaki-shi, Kanagawa (JP)

(72) Inventor: Yasuyuki Kawada, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/067,163

(22) Filed: Mar. 10, 2016

(65) Prior Publication Data
US 2016/0372328 A1   Dec. 22, 2016

(30) Foreign Application Priority Data
Jun. 17, 2015  (JP) .................. 2015-122083

(51) Int. Cl.
*H01L 21/04*    (2006.01)
*H01L 21/324*   (2006.01)
*H01L 29/16*    (2006.01)
*H01L 21/66*    (2006.01)

(52) U.S. Cl.
CPC ............ *H01L 22/12* (2013.01); *H01L 21/046* (2013.01); *H01L 21/324* (2013.01); *H01L 29/1608* (2013.01)

(58) Field of Classification Search
None
See application file for complete search history.

(56) References Cited

U.S. PATENT DOCUMENTS

| | | | |
|---|---|---|---|
| 6,193,853 B1* | 2/2001 | Yumshtyk | C23C 14/046 204/192.12 |
| 2008/0291573 A1* | 11/2008 | Murakami | B82Y 10/00 360/135 |
| 2009/0042375 A1* | 2/2009 | Sawada | H01L 21/045 438/522 |
| 2011/0223694 A1* | 9/2011 | Uda | C23C 16/325 438/14 |

FOREIGN PATENT DOCUMENTS

JP        5673107 B2    2/2015

* cited by examiner

*Primary Examiner* — Michael Jung
*Assistant Examiner* — Jay C Chang
(74) *Attorney, Agent, or Firm* — Rabin & Berdo, P.C.

(57) ABSTRACT

A method of manufacturing a silicon carbide semiconductor device includes ion implanting an impurity into a surface of a semiconductor substrate comprised of silicon carbide, forming a protective film in the surface implanted with the impurity, and heat treating the semiconductor substrate covered by the protective film to activate the impurity. During formation of the protective film, the protective film has a 2-layer structure including a first protective film in the surface of the semiconductor substrate that supplies atoms that become insufficient in the semiconductor substrate as a result of the heat treating, and a second protective film in a surface of the first protective film that suppresses vaporization of silicon atoms from the first protective film. The first protective film may be a silicon film and the second protective film may be a carbon film or a carbon nitride film.

9 Claims, 4 Drawing Sheets

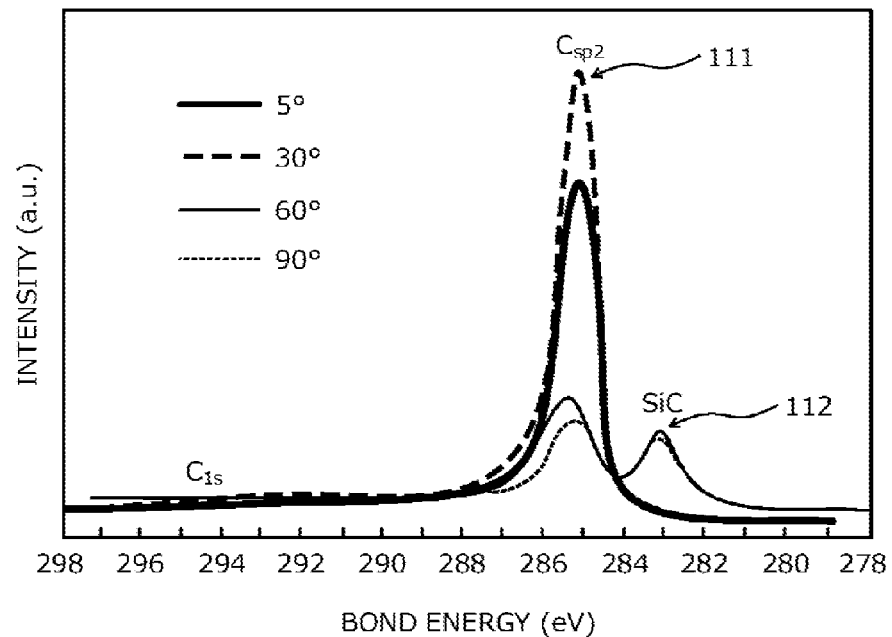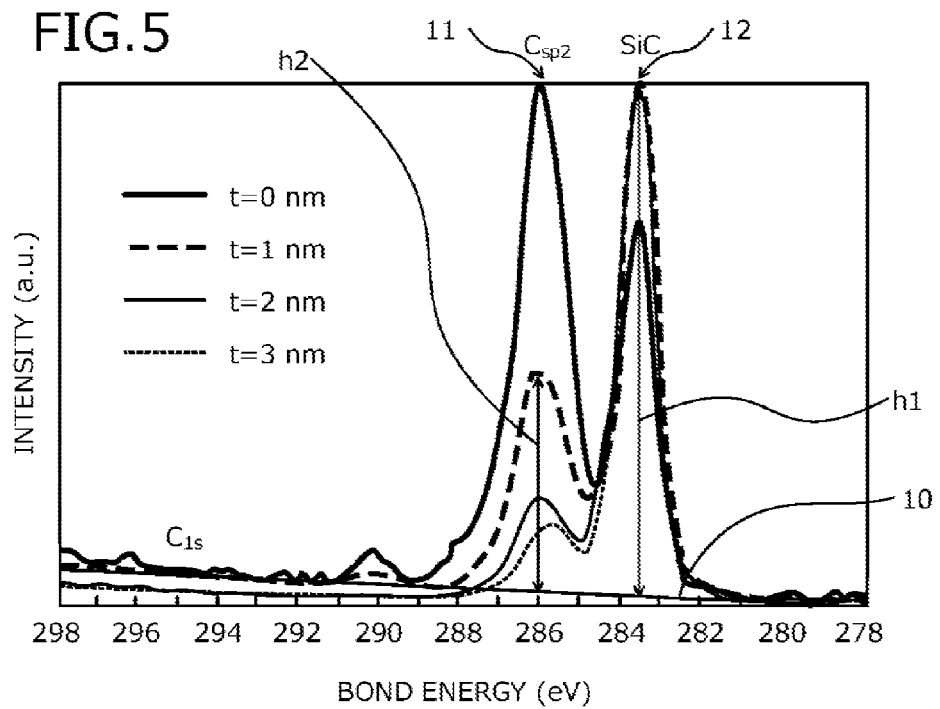

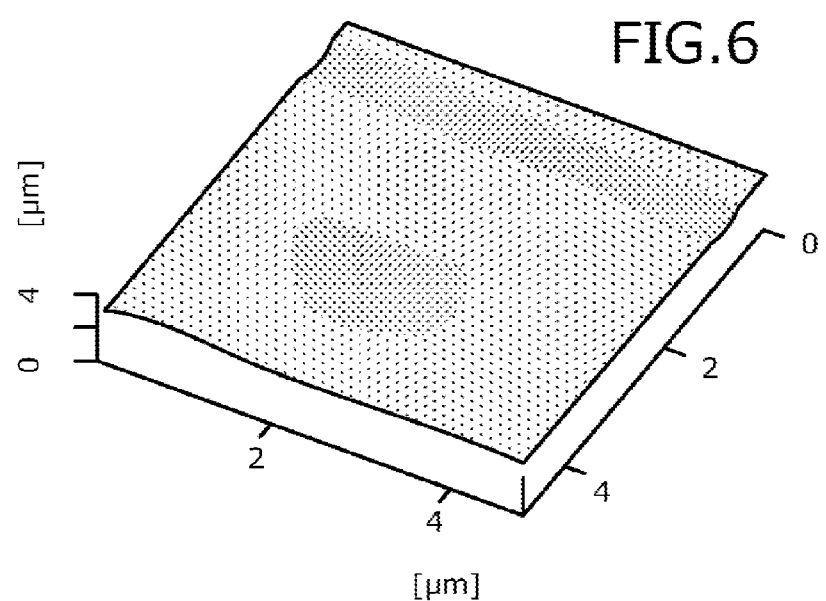

METHOD OF MANUFACTURING A SILICON CARBIDE SEMICONDUCTOR DEVICE INCLUDING FORMING A PROTECTIVE FILM WITH A 2-LAYER STRUCTURE COMPRISED OF SILICON AND CARBON

CROSS REFERENCE TO RELATED APPLICATIONS

This non-provisional application is based upon and claims the benefit of priority of the prior Japanese Patent Application No. 2015-122083 filed on Jun. 17, 2015, the entire contents of which are incorporated herein by reference.

BACKGROUND OF THE INVENTION

1. Field of the Invention

The embodiment discussed herein is related to a method of manufacturing a silicon carbide semiconductor device.

2. Description of the Related Art

Conventionally, when various types of devices are produced using a silicon carbide (SiC) substrate or a silicon carbide epitaxial substrate where an epitaxial layer is stacked on starting substrate (hereinafter, collectively, silicon carbide substrate), an ion implantation process is necessary for forming the device structures. After the ion implantation process, activation heat treatment is necessary to activate the impurity ion-implanted into the silicon carbide substrate and when silicon carbide is used as a semiconductor material, the activation heat treatment has to be performed at a high temperature of about 1600 to 1800 degrees C. Since activation heat treatment is performed at such a high temperature, when the activation heat treatment is performed without protecting the surface of the silicon carbide substrate by a protective film, the surface of the silicon carbide substrate is known to become rough.

A method of performing activation heat treatment in an argon (Ar) gas atmosphere doped with silane ($SiH_4$) gas has been proposed as a method of reducing surface roughness of a silicon carbide substrate accompanying activation heat treatment. Further, a method of performing activation heat treatment where the surface of the silicon carbide substrate is covered by a carbon (C) film, after an impurity is ion-implanted into the silicon carbide substrate is commonly known as another method of reducing surface roughness occurring consequent to activation heat treatment (for example, refer to Japanese Patent No. 5673107). Methods such as sputtering, chemical vapor deposition (CVD), and application of carbonizing resist to the surface of a silicon carbide substrate are used as methods of depositing (forming) a carbon film.

Nonetheless, as a result of earnest research by the inventor, it is clear that in a method of performing activation heat treatment in a gas atmosphere doped with silane gas, it is difficult to suppress surface roughness of the silicon carbide substrate. Further, even in a method of performing activation heat treatment with the surface of the silicon carbide substrate covered by a carbon film, depending on the heat treatment equipment and heat treatment conditions, surface roughness of the silicon carbide substrate may occur. This is because cracks occur in the carbon film depending on the deposition method (sputtering, CVD, spin-coat method) of the carbon film and heat treatment conditions. Further, even when cracks do not occur in the carbon film, if the thickness and/or film quality of the carbon film are insufficient to function as a protective film, surface roughness of the silicon carbide substrate may occur. Therefore, to improve yield, ensure device reliability, etc., there is room for improving methods of forming a protective film that protects the surface of a silicon carbide substrate during activation heat treatment.

SUMMARY OF THE INVENTION

According to one aspect of the present disclosure, a method of manufacturing a silicon carbide semiconductor device includes ion implanting an impurity from a surface of a semiconductor substrate comprising silicon carbide; forming a protective film in the surface implanted with the impurity; and heat treating the semiconductor substrate covered by the protective film to activate the impurity. In forming the protective film, the protective film is of a 2-layer structure comprising a first protective film that is formed in the surface of the semiconductor substrate and supplies atoms that become insufficient in the semiconductor substrate consequent to heat treating, and a second protective film that is formed in a surface of the first protective film and suppresses vaporization of silicon atoms from the first protective film.

In the method, the first protective film comprises a silicon film.

In the method, the second protective film comprises a carbon film or a carbon nitride film.

In the method, the first protective film is formed by sputtering in an argon gas atmosphere and using a silicon target.

In the method, the first protective film is of a thickness from 1 nm to 3 nm.

In the method, the second protective film is formed by sputtering in an argon gas atmosphere or an argon gas atmosphere comprising nitrogen, and using a carbon target.

In the method, the second protective film is of a thickness that is at least 20 nm.

The method further includes removing the second protective film after heat treating to activate the impurity.

In the method, the first protective film is of a thickness set such that when the surface implanted with the impurity is analyzed using an X-ray photoelectron spectroscopy method after removing the second protective film, an intensity at a peak corresponding to carbon detected in the surface of the semiconductor substrate becomes less than an intensity at a peak corresponding to silicon carbide.

In the method, the first protective film is of a thickness set such that when after removing the second protective film, the surface implanted with the impurity is analyzed using the X-ray photoelectron spectroscopy method for which an X-ray irradiation angle is 45°, a ratio of the intensity at the peak corresponding to the carbon of a sp2 bond appearing with bond energy of 285 eV to 286 eV to the intensity at the peak corresponding to the silicon carbide appearing with bond energy of 283 eV to 284 eV is at most 0.4.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a graph of chemical bonding states in the surface of the silicon carbide substrate in the conventional method of manufacturing a silicon carbide semiconductor device;

FIG. 5 is a graph of chemical bonding states in a surface of a silicon carbide substrate in the method of manufacturing a silicon carbide semiconductor device according to the present disclosure; and FIG. 6 is a bird's eye view of the surface of the silicon carbide substrate in the method of manufacturing a silicon carbide semiconductor device according to the present disclosure.

DETAILED DESCRIPTION OF THE INVENTION

Figure 1A:
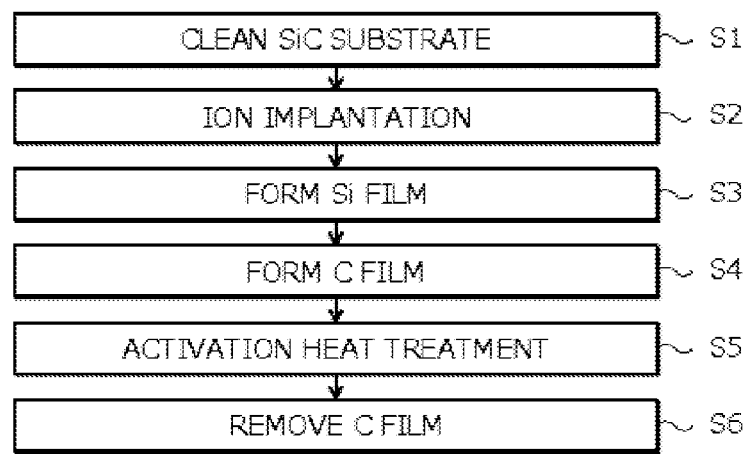
FIG. 1A is a flowchart outlining a method of manufacturing a silicon carbide semiconductor device according to an embodiment.

A preferred embodiment of a method of manufacturing a silicon carbide semiconductor device according to the present disclosure will be described in detail with reference to the accompanying drawings. In the description of the embodiments below and the accompanying drawings, identical constituent elements will be given the same reference numerals and will not repeatedly be described. When Miller indices are described, "−" means a bar added to an index immediately after the "−", and a negative index is expressed by prefixing "−" to the index.

Embodiment

Figure 1B:
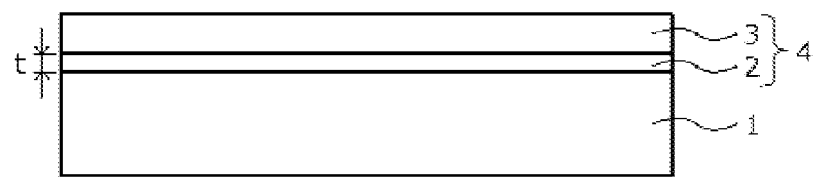
FIG. 1B is a cross-sectional view of a silicon carbide semiconductor device during manufacture according to the embodiment.

The method of manufacturing a silicon carbide semiconductor device according to the embodiment will be described. FIG. 1A is a flowchart outlining the method of manufacturing a silicon carbide semiconductor device according to the embodiment. FIG. 1B is a cross-sectional view of a silicon carbide semiconductor device during manufacture according to the embodiment. First, a silicon carbide substrate (semiconductor wafer) 1 is prepared and cleaned by a general organic cleaning method, RCA cleaning method, etc. (step S1). The silicon carbide substrate 1, for example, may be a silicon carbide bulk substrate having a front surface that is, for example, a (000-1) face (so-called C face) tilted about 4 degrees (off angle) with respect to a crystal axis. Further, the silicon carbide substrate 1, for example, may be a silicon carbide epitaxial substrate where an epitaxial layer is stacked on a starting substrate having silicon carbide as a material. In other words, the silicon carbide substrate 1, for example, is a semiconductor substrate having four-layer periodic hexagonal (4H—SiC) silicon carbide as a material.

Next, the silicon carbide substrate 1 is heated at, for example, a temperature of about 500 degrees C. and by general ion implantation equipment, an impurity is implanted from a front surface of the silicon carbide substrate 1 (hereinafter, ion implantation surface) (step S2). The ion implantation at step S2 is an ion implantation process for forming a device structure of a predetermined device in the silicon carbide substrate 1 and the type of ion and dosing volume differs according to design conditions of each device. For instance, nitrogen (N) is implanted by acceleration energy of about 290 keV or greater and 700 keV or less such that at a depth of about 0.45 µm or greater and 0.85 µm or less from a substrate front surface, the total dosing volume has a box profile of about $2 \times 10^{14}/cm^2$. Further, phosphorous (P) is implanted by acceleration energy of about 20 keV or greater and 350 keV or less such that at a depth of about 0.35 µm or less from the substrate front surface, the total dosing volume has a box profile of about $8 \times 10^{14}/cm^2$.

Next, for example, a material film is formed that supplies atoms that become insufficient in the silicon carbide substrate 1 consequent to the activation heat treatment described hereinafter; more specifically, a silicon (Si) film (first protective film) 2 is formed on the ion implantation surface of the silicon carbide substrate 1, as a protective film 4 by sputtering (step S3). Atoms that become insufficient in the silicon carbide substrate 1 consequent to heat treatment are silicon atoms that are vaporized from the silicon carbide substrate 1 during the activation heat treatment. Next, for example, a carbon (C) film or a carbon nitride film (CNx) (hereinafter, collectively, carbon film (second protective film) 3) is formed in a surface of the silicon film 2, as the protective film 4 by sputtering (step S4). In other words, by the processes at steps S3 and S4, the protective film 4 of a 2-layer structure in which the silicon film 2 and the carbon film 3 are sequentially stacked, is formed on the ion implantation surface of the silicon carbide substrate 1.

At step S3, for example, processing may be such that the silicon carbide substrate 1 is placed inside a processing furnace (chamber) of direct current (DC) magnetron sputtering equipment and magnetron sputtering is performed in an argon (Ar) gas atmosphere using 99.99% pure silicon target to form the silicon film 2. Here, for example, the substrate temperature is about room temperature (e.g., 25 degrees C.) or higher and 300 degrees C. or less and the direct current may be adjusted to be 1 W/cm². A thickness t of the silicon film 2, for example, is set based on activation heat treatment conditions described hereinafter, carbon film thickness and film quality, etc., such that the ion implantation surface of the silicon carbide substrate 1 or the elemental composition or elemental content, bonding state, etc. at a predetermined depth from the ion implantation surface of the silicon carbide substrate 1, after the activation heat treatment become predetermined conditions described hereinafter. More specifically, the thickness t of the silicon film 2 is preferably, for example, about 1 nm or greater and 3 nm or less (1≤t≤3). The reason for this is as follows. When the thickness t of the silicon film 2 is less than 1 nm (t<1), the silicon film 2 may not function sufficiently as the protective film 4. Further, when the thickness t of the silicon film 2 exceeds 3 nm (t>3), the silicon film 2 remains in the ion implantation surface of the silicon carbide substrate 1. As a result, when the carbon (C) film 3 described hereinafter is removed (e.g., oxygen ashing), silicon oxide ($SiO_2$) may form in the ion implantation surface of the silicon carbide substrate 1. Therefore, the thickness t of the silicon film 2 is further preferably set such that the silicon film 2 substantially does not remain after activation heat treatment.

At step S4, for example, the carbon film 3 may be formed by sputtering using a 99.99% pure carbon target in an argon (Ar) gas atmosphere or a nitrogen ($N_2$) gas doped argon gas atmosphere. Here, for example, the substrate temperature may be room temperature or higher and 300 degrees C. or less, and direct current power may be adjusted to 2 W/cm². Preferably, after the processing at step S3, the silicon carbide substrate 1 is not exposed to air and, for example, the processing at step S4 is continued from the processing at step S3, using the same sputtering equipment. The thickness of the carbon film 3 varies according to the device structure, deposition equipment, the heat treatment equipment used in the activation heat treatment described hereinafter, etc. and is set to a thickness to sufficiently achieve the effects of the present invention. More specifically, the thickness of the carbon film 3, for example, may be 20 nm. Further, for example, in cases where a step occurs in the ion implantation surface of the silicon carbide substrate 1 consequent to a device structure, etc., the carbon film 3 is made thicker (e.g., 20 nm or greater) according to step coverage of the carbon film 3. According to specifications of the deposition equipment, heat treatment equipment, etc., the carbon film 3 is made thicker (e.g., 20 nm or greater).

Next, activation heat treatment for activating an impurity implanted into the silicon carbide substrate 1 is performed (step S5). At step S5, for example, the silicon carbide substrate 1 is placed in a processing furnace of the heat treatment equipment and the processing furnace is evacuated to a level of about $7.5 \times 10^{-5}$ Torr or less. Thereafter, argon gas may be introduced into the processing furnace and at a pressure of about 60 Torr or greater and 100 Torr or less, the activation heat treatment may be performed at a temperature of about 1600 degrees C. or higher and 1800 degrees C. or less for 1 minute or longer and 5 minutes or less. During this activation heat treatment, silicon atoms are supplied to the ion implantation surface of the silicon carbide substrate 1 from the silicon film 2 and the silicon film 2 substantially does not remain. Next, the silicon carbide substrate 1 is cooled to a temperature enabling removal from the processing furnace of the heat treatment equipment, and the carbon film 3 is removed (ashing) (step S6). The ashing at step S6, for example, may be performed for about 5 minutes in oxygen plasma generated by reducing the pressure of oxygen ($O_2$) gas introduced into a processing furnace of ashing equipment to about 5 Pa and supplying high frequency (radio frequency (RF)) electrical power. Subsequent processes are sequentially performed to form remaining device structures and the semiconductor wafer is cut into chips (dicing) to thereby complete the silicon carbide semiconductor device according to the embodiment.

Figure 2:
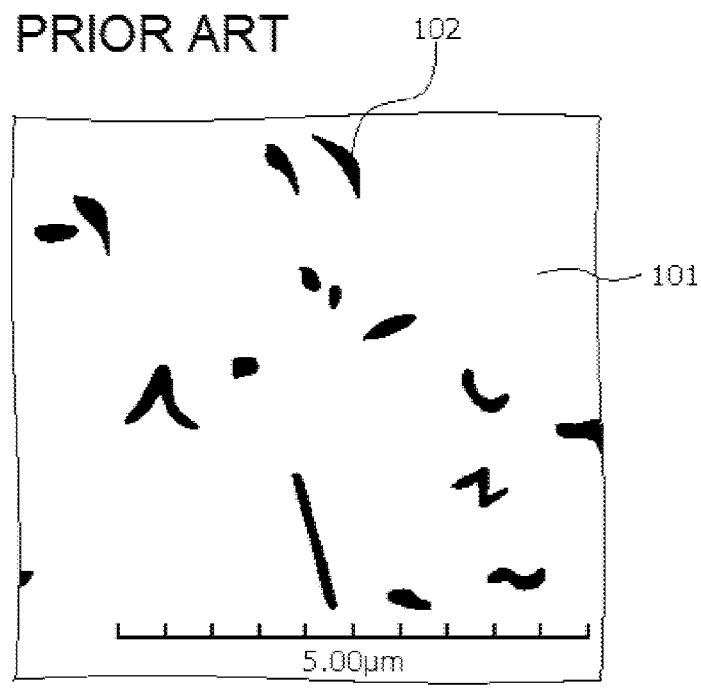
FIG. 2 is a diagram schematically depicting a state of a surface of a silicon carbide substrate in a conventional method of manufacturing a silicon carbide semiconductor device.
Figure 3:
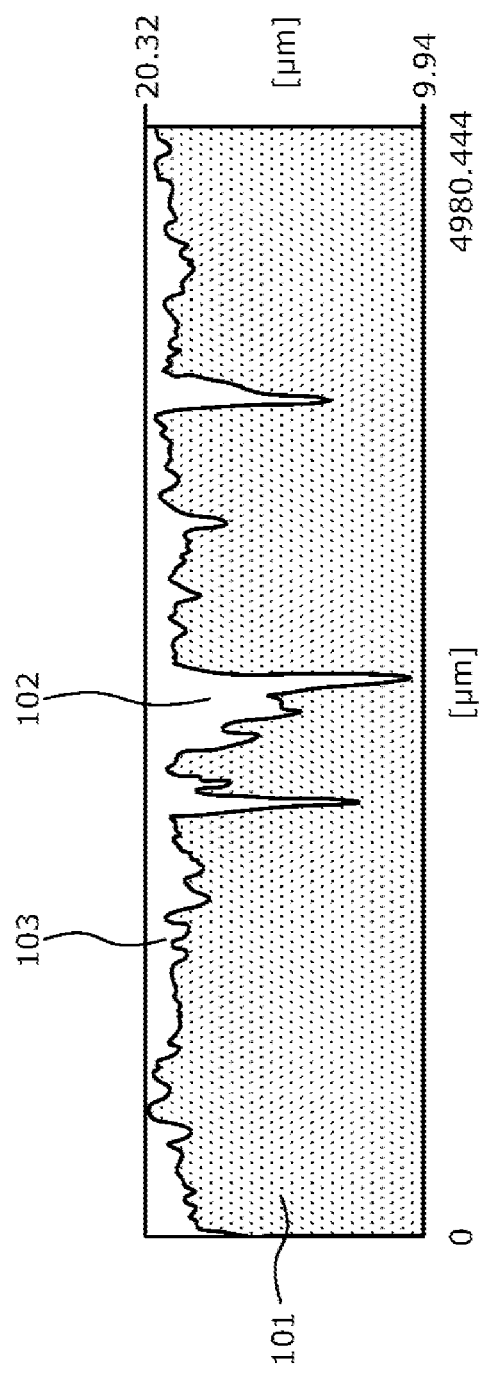
FIG. 3 is a cross-sectional view of unevenness of the surface of the silicon carbide substrate in the conventional method of manufacturing a silicon carbide semiconductor device.

The state of the surface of a silicon carbide substrate in the method of manufacturing a silicon carbide semiconductor device according to the embodiment was verified. First, for comparison, the state of the surface of a silicon carbide substrate in a conventional method of manufacturing a silicon carbide semiconductor device will be described. FIG. 2 is a diagram schematically depicting the state of the surface of a silicon carbide substrate in a conventional method of manufacturing a silicon carbide semiconductor device. FIG. 3 is a cross-sectional view of unevenness of the surface of the silicon carbide substrate in the conventional method of manufacturing a silicon carbide semiconductor device. FIG. 4 is a graph of chemical bonding states in the surface of the silicon carbide substrate in the conventional method of manufacturing a silicon carbide semiconductor device. As an example of a conventional silicon carbide substrate (conventional example), samples were prepared by forming only a carbon film (not depicted) as a protective film in a primary surface that is the side of the silicon carbide substrate 101 on which ion implantation is performed (hereinafter, ion implantation surface) and removing (ashing) the carbon film after performing activation heat treatment for 5 minutes in an argon atmosphere at a temperature of 1700 degrees C.

Results of observing the ion implantation surface of the conventional example by a scanning electron microscope (SEM), at a magnification of 10000× are depicted in FIG. 2.

Results of observing a cross-section of the ion implantation surface of the conventional example by an atomic force microscope (AFM) are depicted in FIG. 3. Chemical bond states of the ion implantation surface of the conventional example detected by an X-ray photoelectron spectroscopy (XPS) method are depicted in FIG. 4. The horizontal axis in FIG. 4 represents bond energy (eV) of atoms and the vertical axis represents photoelectron intensity (arbitrary unit (a.u.)). In FIG. 4, the smaller the X-ray irradiation angle is, the closer the depth (shallowness) is to the most superficial surface (similarly in FIG. 5). Here, a sample in which surface roughness occurred in the ion implantation surface is selected. As depicted in FIG. 2, in the conventional example, recesses (black portions) 102 are observed in various places in the ion implantation surface and surface roughness was confirmed.

From the results depicted in FIG. 3, the depth of the recesses 102 occurring in the ion implantation surface of the conventional example is from several nm to about 10 nm and even in portions where the recesses 102 do not occur, unevenness 103 of about 1 nm was confirmed to occur. In the results depicted in FIG. 4, it was confirmed that in the conventional example, at a shallow portion from the ion implantation surface (X-ray irradiation angles: 5° and 30°), a peak 111 corresponding to sp2 bond carbon ($C_{sp2}$) was confirmed in a vicinity of 285 eV. Further, at a shallow portion from the ion implantation surface (X-ray irradiation angles: 60° and 90°), a mixed state of the peak 111 (near 285 eV) corresponding to sp2 bond carbon ($C_{sp2}$) and a peak 112 (near 283 eV) corresponding to silicon carbide (SiC) was confirmed. In other words, it was found that the shallower the depth from the ion implantation surface is, only silicon atoms are vaporized and removed from the silicon carbide and carbon predominates. Bond energy higher than the peak 111 corresponding to sp2 bond carbon ($C_{sp2}$) is a peak corresponding to the is orbital of carbon ($C_{1s}$). Thus, it was found that silicon atoms easily vaporize from the ion implantation surface consequent to the high-temperature activation heat treatment in the argon gas atmosphere and this is a factor contributing to surface roughness of the silicon carbide substrate 101.

From these results, it was confirmed that when high-temperature activation heat treatment is performed with the ion implantation surface of the silicon carbide substrate protected by only a carbon film, depending on the state of the carbon film (thickness, film quality) and heat treatment equipment, the carbon film does not sufficiently function as a protective film and surface roughness occurs in the ion implantation surface. In other words, it was found that with only a carbon film as a protective film such as the conventional example, the vaporization of silicon atoms from the ion implantation surface of the silicon carbide substrate 1 cannot be sufficiently suppressed. In the conventional example, although this phenomenon does not always occur, by the earnest research of the inventor, the phenomenon was confirmed to occur at a rate of 1 time every several times. More specifically, for example, it was confirmed that when sputtering equipment and/or the processing furnace of the heat treatment equipment for depositing the carbon film is changed, reproducibility is not obtained even when processing is performed by the same methods and conditions; and surface roughness occurs in the ion implantation surface.

The state of the surface of the silicon carbide substrate 1 in the method of manufacturing a silicon carbide semiconductor device according to the present disclosure will be described. FIG. 5 is a graph of chemical bonding states in the surface of the silicon carbide substrate in the method of manufacturing a silicon carbide semiconductor device according to the present disclosure. FIG. 6 is a bird's eye view of the surface of the silicon carbide substrate in the method of manufacturing a silicon carbide semiconductor device according to the present disclosure. A sample (hereinafter, example) was prepared according to the method of manufacturing a silicon carbide semiconductor device according to the embodiment described above, where the protective film 4 of the silicon film 2 and the carbon film 3 sequentially stacked was formed in the ion implantation surface of the silicon carbide substrate 1 and after activation heat treatment, the carbon film 3 was removed (ashing). Conditions of the activation heat treatment were identical to those of the conventional example above.

Chemical bond states of the ion implantation surface of the example detected by an XPS method are depicted in FIG. 5. The X-ray irradiation angle at the time of detection was 45°. The values depicted in the annotation of FIG. 5 are for the thickness t of the silicon film 2. The thickness t of the silicon film 2 of each of the samples of the example was 0 nm to 3 nm. The thickness t of the silicon film 2=0 nm is the state of the carbon film 3 alone formed as the protective film 4 without the silicon film 2; and corresponds to the conventional technique. In the sample of the thickness t of the silicon film 2 equal to 0 nm, a sample for which surface roughness occurred in the ion implantation surface is selected. The photoelectron intensity (values on the vertical axis) depicted in FIG. 5 display relative values as a peak 11 corresponding to sp2 bond carbon ($C_{sp2}$) for the thickness t of the silicon film 2 equal to 0 nm. The peak 12 corresponding silicon carbide (SiC) is detected to be of a lower energy than the peak 11 corresponding to the sp2 bond carbon and a peak corresponding to the 1s orbital of carbon ($C_{1s}$) is detected to be of a higher bond energy than the peak 11 corresponding to sp2 bond carbon, similar to the conventional example (refer to FIG. 4).

From the results depicted in FIG. 5, it was found that with the thickness t of the silicon film 2 equal to 0 nm, similar to the conventional example above, the intensity at the peak 11 corresponding to sp2 bond carbon is greater than the intensity at the peak 12 corresponding to silicon carbide. On the other hand, it was confirmed that by setting the thickness t of the silicon film 2 to be 1 nm, as compared to a case where the thickness t of the silicon film 2 is 0 nm, the intensity at the peak 11 corresponding to sp2 bond carbon can be significantly reduced and the intensity at the peak 12 corresponding to silicon carbide can be relatively increased. Further, it was confirmed that by making the thickness t of the silicon film 2 thicker at 2 nm and 3 nm, the ratio of the intensity at the peak 12 corresponding to silicon carbide with respect to the intensity at the peak 11 corresponding to sp2 bond carbon can be further increased.

For example, when the ion implantation surface of the silicon carbide substrate 1 is analyzed using an XPS method where the X-ray irradiation angle is 45°, a ratio of an intensity h1 at the peak 12 corresponding to silicon carbide appearing around a bond energy of 283 eV to 284 eV standardized to 1.0 and an intensity h2 at the peak 11 corresponding to sp2 bond carbon appearing around a bond energy of 285 eV to 286 eV (=h2/h1) is preferably 0.4 or less. The intensities h1 and h2 are values subject to general background correction. In FIG. 5, for example, a case where background correction is performed by a linear approximation method is depicted and in this case, the intensities h1 and h2 are values obtained by subtracting the background intensity from a measured value based on an approximation line 10 of background intensity. The approximation line 10 of the background intensity is a straight line connecting 2 points between the peak 11 corresponding to sp2 bond carbon and the peak 12 corresponding to silicon carbide (the 2 points including the end of the high bond energy side of the peak 11 corresponding to sp2 bond carbon and the low bond energy side of the peak corresponding to silicon carbide).

From the results, it was confirmed that by further inserting the silicon film 2 between the silicon carbide substrate 1 and the carbon film 3 as the protective film 4, vaporization of silicon atoms from the ion implantation surface of the silicon carbide substrate 1 can be significantly suppressed. In other words, it was confirmed that during the activation heat treatment, silicon atoms are supplied from the silicon film 2 to the ion implantation surface of the silicon carbide substrate 1. If the thickness t of the silicon film 2 is greater than 3 nm (t>3), as described above, the silicon film 2 remains in the ion implantation surface of the silicon carbide substrate 1 whereby silicon oxide may be formed. Therefore, the thickness t of the silicon film 2 is preferably a thickness that supplies silicon atoms to the ion implantation surface of the silicon carbide substrate 1 to an extent that in the ion implantation surface of the silicon carbide substrate 1, the peak 11 corresponding to sp2 bond carbon remains at an intensity that is lower than the intensity at the peak 12 corresponding to silicon carbide (i.e., silicon atoms do not remain).

Results of observing a planar state of a 5 μm×5 μm range of the ion implantation surface of the example, by AFM, are depicted in FIG. 6. FIG. 6 depicts the ion implantation surface of the example when the thickness t of the silicon film 2 is 3 nm. In the example (refer to FIG. 3), within a 5 μm range, although numerous recesses 102 and unevenness 103 is observed and surface roughness occurs, as depicted in FIG. 6, in the example, the flatness is extremely favorable and the root mean square (RMS) of height differences (steps) of the unevenness of the ion implantation surface measured from an AFM image was 0.15 nm.

From these results, it was confirmed that by further inserting the silicon film 2 between the silicon carbide substrate 1 and the carbon film 3 as the protective film 4, the ion implantation surface of the silicon carbide substrate 1 can be maintained extremely flat. Therefore, in the present disclosure, even in the production (manufacture) of a silicon carbide semiconductor device, the reliability of the silicon carbide semiconductor device can be improved. The results depicted in FIGS. 5 and 6 were confirmed by the inventor to be reproducible even when sputtering equipment and/or the processing furnace of heat treatment equipment is changed.

As described, according to the embodiment, by making the protective film formed in the ion implantation surface of the silicon carbide substrate a 2-layer structure of a silicon film and a carbon film sequentially stacked, the surface of the silicon film becomes the most superficial surface of the silicon layer (the stacked silicon carbide substrate and silicon film). As a result, the ion implantation surface of the silicon carbide substrate is positioned deeply at a depth corresponding to the thickness of the silicon film from the most superficial surface of the silicon layer and therefore, during activation heat treatment, the vaporization of silicon atoms from the ion implantation surface of the silicon carbide substrate can be suppressed. Further, during activation heat treatment, even when silicon atoms vaporize from the ion implantation surface of the silicon carbide substrate, silicon atoms are supplied from the silicon film that contacts the ion implantation surface of the silicon carbide substrate, repairing locations where silicon atoms of the ion implantation surface of the silicon carbide substrate are vaporized. As a result, surface roughness does not occur in the ion implantation surface of the silicon carbide substrate consequent to activation heat treatment and even after the activation heat treatment, the flatness of the ion implantation surface of the silicon carbide substrate is maintained. Therefore, the reliability of the silicon carbide semiconductor device can be improved. Further, by making the protective film of the 2-layer structure above, the silicon film is covered by the carbon film, enabling vaporization of silicon atoms from the silicon film to be suppressed. Therefore, setting of the thickness of the silicon film becomes easy.

The present invention is not limited to the above embodiment and can be changed within a scope not departing from the spirit of the invention. For example, in the embodiment above, although description is given taking an example where the front surface of the silicon carbide substrate is a (000-1) face having an off angle of about 4°, the front surface of the silicon carbide substrate may be a (0001) face (so-called Si face), and the off angle may be varied. Even when an impurity is ion implanted from the back surface of a silicon carbide substrate, by sequentially forming a silicon film and a carbon film on the back surface of the silicon carbide substrate as the protective film, the same effects are obtained.

Further, the present invention is applicable to various silicon carbide semiconductor devices that use silicon carbide as a semiconductor material and in which device structures are formed by ion implantation followed by activation heat treatment. For example, the present invention may be applied to a metal oxide semiconductor field effect transistor (MOSFET), an insulated gate bipolar transistor (IGBT), a Schottky barrier diode (SBD), etc.

According to the disclosure described above, during heat treatment, the vaporization of silicon atoms from the ion implantation surface (impurity implanted surface of semiconductor substrate of silicon carbide) of a silicon carbide substrate can be suppressed. Further, during heat treatment, even when silicon atoms are vaporized from the ion implantation surface of the silicon carbide substrate, silicon atoms from the silicon film that contacts the ion implantation surface of the silicon carbide substrate are supplied, repairing locations where silicon atoms of the ion implantation surface of the silicon carbide substrate are vaporized.

According to the method of manufacturing a silicon carbide semiconductor device of the present disclosure, an effect is achieved in that surface roughness of the silicon carbide substrate can be suppressed.

As described, the method of manufacturing a silicon carbide semiconductor device according to the present disclosure is useful for a silicon carbide semiconductor device where a device structure is formed by ion implantation followed by activation heat treatment.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:
   ion implanting an impurity into a surface of a semiconductor substrate comprised of silicon carbide;
   forming a protective film in the surface implanted with the impurity; and
   heat treating the semiconductor substrate covered by the protective film to activate the impurity,
   wherein, during forming the protective film, the protective film has a 2-layer structure comprising
      a first protective film that is a silicon film comprised of silicon, and that is formed in the surface of the semiconductor substrate and supplies atoms that become insufficient in the semiconductor substrate consequent to the heat treating, and
      a second protective film that is formed in a surface of the first protective film and suppresses vaporization of silicon atoms from the first protective film.

2. The method according to claim 1, wherein the second protective film is a carbon film comprised of carbon or a carbon nitride film comprised of carbon nitride.

3. The method according to claim 1, wherein the first protective film is formed by sputtering in an argon gas atmosphere using a silicon target.

4. The method according to claim 1, wherein the first protective film has a thickness ranging from 1 nm to 3 nm.

5. The method according to claim 1, wherein the second protective film is formed by sputtering in an argon gas atmosphere or an argon gas atmosphere comprising nitrogen, using a carbon target.

6. The method according to claim 1, wherein the second protective film has a thickness that is at least 20 nm.

7. The method according to claim 1, further comprising removing the second protective film after heat treating to activate the impurity.

8. The method according to claim 7, wherein the first protective film has a thickness set such that when the surface implanted with the impurity is analyzed using an X-ray photoelectron spectroscopy method after removing the second protective film, a peak corresponding to carbon detected in the surface of the semiconductor substrate has an intensity that becomes less than that of a peak corresponding to silicon carbide.

9. The method according to claim 8, wherein
   the first protective film has a thickness set such that, when the surface implanted with the impurity is analyzed using the X-ray photoelectron spectroscopy method, for which an X-ray irradiation angle is 45°, after removing the second protective film, a ratio of intensity at a peak corresponding to carbon with a sp2 bond appearing with a bond energy of 285 eV to 286 eV to intensity at a peak corresponding to silicon carbide appearing with a bond energy of 283 eV to 284 eV is at most 0.4.

* * * * *